(12) United States Patent
Arabpour Roghabadi et al.

(10) Patent No.: US 10,347,432 B2
(45) Date of Patent: Jul. 9, 2019

(54) RECOVERING A DEGRADED SOLAR CELL

(71) Applicants: Farzaneh Arabpour Roghabadi, Tehran (IR); Nasibeh Mansour Rezaei Fumani, Karaj (IR); Maryam Alidaei, Tehran (IR); Vahid Ahmadi, Tehran (IR); Seyed Mojtaba Sadrameli, Tehran (IR); Morteza Izadifard, Shahrood (IR); Mohammad Ebrahim Ghazi, Shahrood (IR)

(72) Inventors: Farzaneh Arabpour Roghabadi, Tehran (IR); Nasibeh Mansour Rezaei Fumani, Karaj (IR); Maryam Alidaei, Tehran (IR); Vahid Ahmadi, Tehran (IR); Seyed Mojtaba Sadrameli, Tehran (IR); Morteza Izadifard, Shahrood (IR); Mohammad Ebrahim Ghazi, Shahrood (IR)

(*) Notice: Subject to any disclaimer, the term of this patent is extended or adjusted under 35 U.S.C. 154(b) by 0 days.

(21) Appl. No.: 15/984,361

(22) Filed: May 20, 2018

(65) Prior Publication Data
US 2018/0269004 A1   Sep. 20, 2018

Related U.S. Application Data

(60) Provisional application No. 62/509,112, filed on May 21, 2017.

(51) Int. Cl.
| H01L 21/00 | (2006.01) |
| G01R 31/26 | (2014.01) |
| H01L 21/66 | (2006.01) |
| H01G 9/20  | (2006.01) |
| H02S 50/10 | (2014.01) |

(52) U.S. Cl.
CPC .......... *H01G 9/2009* (2013.01); *H02S 50/10* (2014.12)

(58) Field of Classification Search
CPC .............................. H01G 9/2009; H02S 50/10
USPC .................................................. 438/4, 14, 16
See application file for complete search history.

(56) References Cited

U.S. PATENT DOCUMENTS

| 9,299,503 B2 * | 3/2016 | Jiang ................... H01L 31/208 |
| 2009/0287446 A1 * | 11/2009 | Wang ................ H01L 31/02167 702/116 |
| 2010/0197051 A1 * | 8/2010 | Schlezinger .......... H01L 31/188 438/16 |
| 2011/0033957 A1 * | 2/2011 | Holden .............. G01B 11/0683 438/16 |

* cited by examiner

*Primary Examiner* — David S Blum
(74) *Attorney, Agent, or Firm* — Bajwa IP Law Firm; Haris Zaheer Bajwa

(57) ABSTRACT

A method for recovering a degraded solar cell is disclosed. The method comprises radiating an ultraviolet (UV) light on the degraded solar cell for a period of time in a range from 30 seconds to 5 minutes.

8 Claims, 11 Drawing Sheets

RECOVERING A DEGRADED SOLAR CELL

CROSS-REFERENCE TO RELATED APPLICATION

This application claims the benefit of priority from pending U.S. Provisional Patent Application Ser. No. 62/509,112, filed on May 21, 2017, and entitled "PERFORMANCE RECOVERY OF DEGRADED THIRD GENERATION SOLAR CELLS," which is incorporated herein by reference in its entirety.

TECHNICAL FIELD

The present disclosure generally relates to solar cells, and particularly, to methods for recovering degraded solar cells.

BACKGROUND

In recent years, the demand for sustainable and clean energy resources has led to a growth in the development of solar cells, which directly convert sun light into electricity. An efficient, stable, and low-cost photovoltaic technology may be used in industrial applications. Silicon photovoltaic cells which are first-generation solar cells are stable, with a long lifetime around 25 years and power conversion efficiencies (PCE) as high as 20%, but their fabrication process may be complex and expensive. Photovoltaic uptake has been growing to introduce sufficient alternatives to conventional solar cells, such as crystalline silicon solar cells. A low-cost and simple fabrication method for solar cells is a solution that provides roll-to-roll printing as a beneficial method for large scale production. Among different types of photovoltaics, polymer solar cells and perovskite solar cells have received extensive attention because of their potential for aiding in developing cheap, light weight, facile, and fast fabricated solar cells. Although these solar cells achieved reasonable PCEs, their short lifetimes due to degradation and lack of reproducibility still remain a challenge. There is, therefore, a need for a method for recovering the performance of degraded solar cells.

SUMMARY

This summary is intended to provide an overview of the subject matter of the present disclosure, and is not intended to identify essential elements or key elements of the subject matter, nor is it intended to be used to determine the scope of the claimed implementations. The proper scope of the present disclosure may be ascertained from the claims set forth below in view of the detailed description below and the drawings.

According to one or more embodiments, the present disclosure describes a method for recovering a degraded solar cell. The method comprises radiating an ultraviolet (UV) light on the degraded solar cell. In an exemplary embodiment, the degraded solar cell may comprise a metal contact.

In an exemplary embodiment, radiating the UV light may comprise radiating the UV light on a side of the degraded solar cell with the metal contact.

According to one exemplary embodiment, radiating the UV light may comprise radiating the UV light by a UV light source with a power in a range of about 100 Watts to about 1000 Watts. The UV light source may be placed at a distance in a range of about 15 cm to 25 cm from the degraded solar cell.

According to an exemplary embodiment, radiating the UV light may comprise radiating the UV light for a period of time. The period of time may be in a range of about 30 seconds to about 5 minutes.

According to an exemplary embodiment, radiating the UV light on the degraded solar cell may comprise radiating the UV light on a degraded polymer solar cell. In other exemplary implementations, radiating the UV light on the degraded solar cell may comprise radiating the UV light on a degraded perovskite solar cell.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the implementations, and be protected by the claims herein.

BRIEF DESCRIPTION OF THE DRAWINGS

The drawing figures depict one or more embodiments in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown, but is to be accorded the widest possible scope consistent with the principles and features disclosed herein.

Disclosed herein is a method for recovering and enhancing the performance of degraded solar cells, and particularly, third generation solar cells. The recovering process may comprise radiating an ultraviolet (UV) light on a solar cell for a limited time. The UV light may be radiated on a side of the solar cell on which a metal contact is located. The radiation time, power of the UV light source, and the distance of the source from the degraded solar cell may be selected in certain ranges. The method can be applied on both degraded and failed devices, i.e., devices with weak performance after fabrication.

Figure 1:
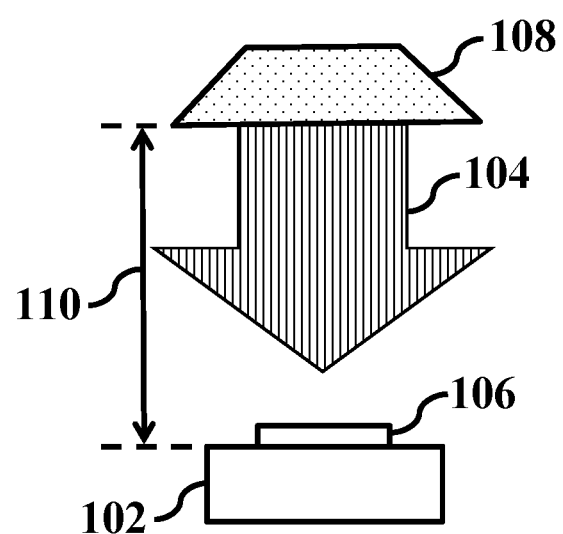
FIG. 1 illustrates a schematic representation of a system for recovering a degraded solar cell, consistent with one or more exemplary embodiments of the present disclosure.

FIG. 1 illustrates a schematic representation of a system for implementing a method for recovering a degraded solar cell 102, consistent with one or more exemplary embodiments of the present disclosure. Referring to FIG. 1, according to an exemplary embodiment, degraded solar cell 102 may include one of a degraded polymer solar cell and a degraded perovskite solar cell. In an exemplary embodiment, the method may include radiating a UV light 104 on degraded solar cell 102. Degraded solar cell 102 may include a metal contact 106. In an exemplary implementation, radiating UV light 104 may include radiating the UV light on a side of degraded solar cell 102 with metal contact 106 for a period of time in a range from about 30 seconds to about 5 minutes. In addition, radiating UV light 104 may include radiating UV light 104 by a UV light source 108 with a power in a range of about 100 Watts to about 1000 Watts. UV light source 108 may be placed at a distance 110 from degraded solar cell 102. In an exemplary embodiment, the distance 110 may be in a range of about 15 cm to about 25 cm.

Example 1: Recovering a Degraded Perovskite Solar Cell

Figure 2A:
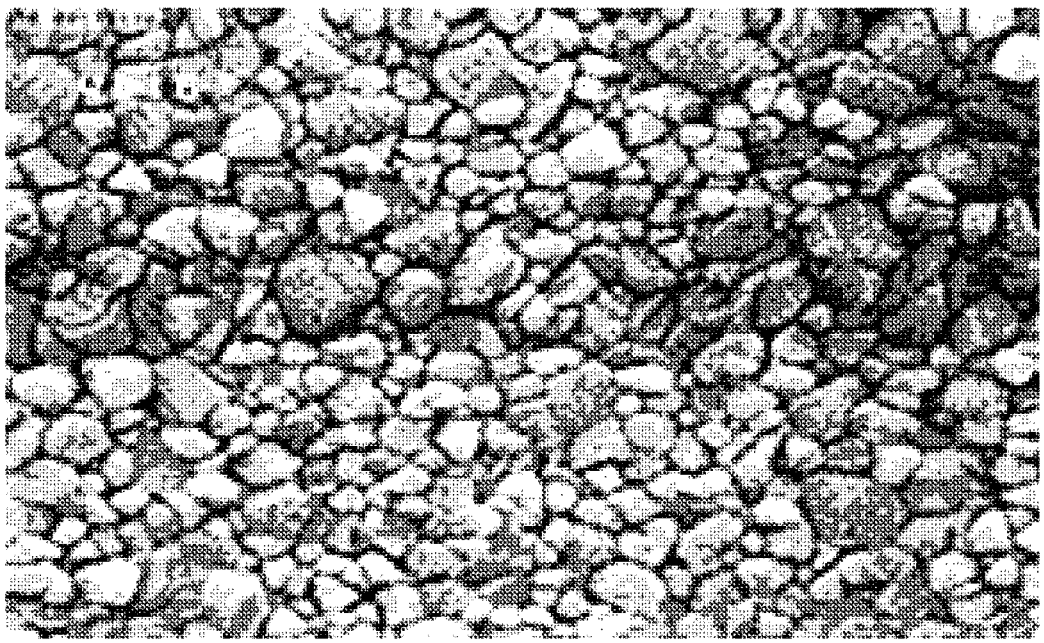
FIG. 2A illustrates a scanning electron microscope (SEM) image of a perovskite active layer of a perovskite solar cell, consistent with one or more exemplary embodiments of the present disclosure.
Figure 2B:
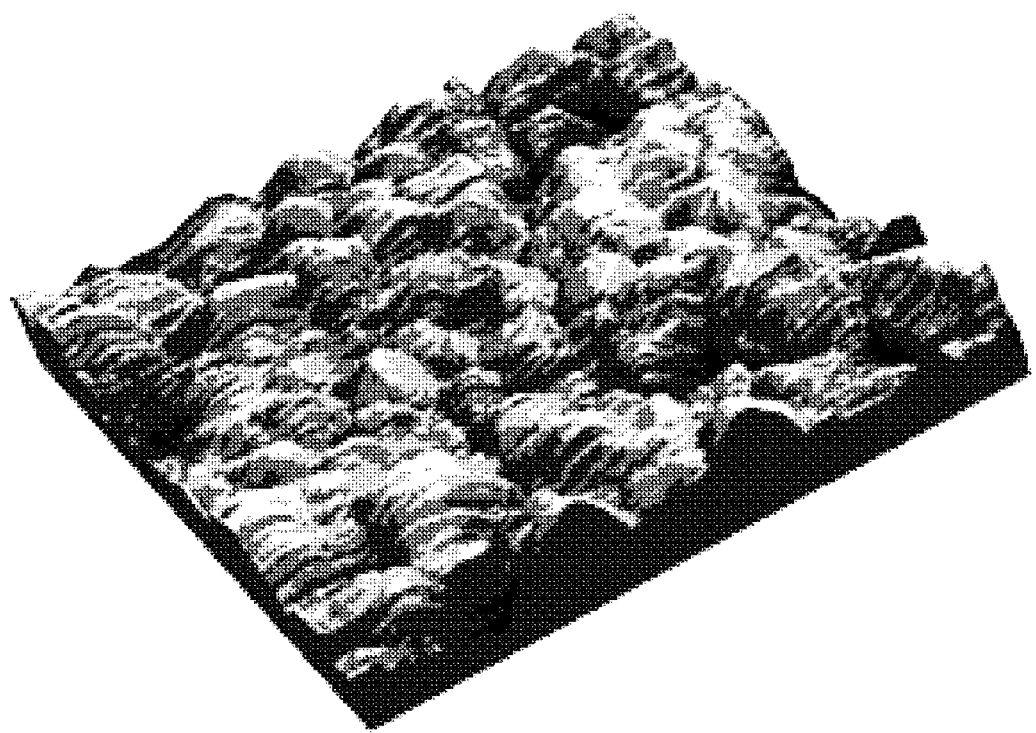
FIG. 2B illustrates a topography image of the perovskite active layer in the perovskite solar cell, consistent with one or more exemplary embodiments of the present disclosure.

In this example, an exemplary degraded perovskite solar cell is recovered by an exemplary implementation of the disclosed method. To fabricate the exemplary perovskite solar cell, a plurality of etched fluorine doped tin oxide (FTO) coated glass substrates are first cleaned with deionized water, acetone, and isopropanol. After drying the substrates at a temperature of about 100° C. for about 30 minutes, they are coated with a compact layer of $TiO_2$ by spin coating a mild acidic solution of tetraisopropyl orthotitanate in ethanol followed by annealing at about 500° C. for about 30 min. The compact layer is treated by a $TiCl_4$ solution and annealed at about 500° C. for about 30 min. Then, the mesoporous $TiO_2$ layer is deposited by spin coating of a $TiO_2$ paste at about 5000 RPM for about 30 s, dried at about 70° C. for about 30 min, annealed at about 500° C., and finally is treated by $TiCl_4$. A perovskite layer is deposited via a two-step process from a $PbI_2$ precursor solution (about 1M in an anhydrous DMF) and a $CH_3NH_3I$ solution (about 7 mg/ml in an anhydrous IPA). Then, the surface morphology of the active layer is obtained by scanning electron microscopy (SEM) and its topography is obtained by atomic force microscopy (AFM). FIG. 2A shows a SEM image of the perovskite active layer of the exemplary perovskite solar cell. FIG. 2B shows a topography image of the perovskite active layer of the exemplary perovskite solar cell.

Figure 3A:
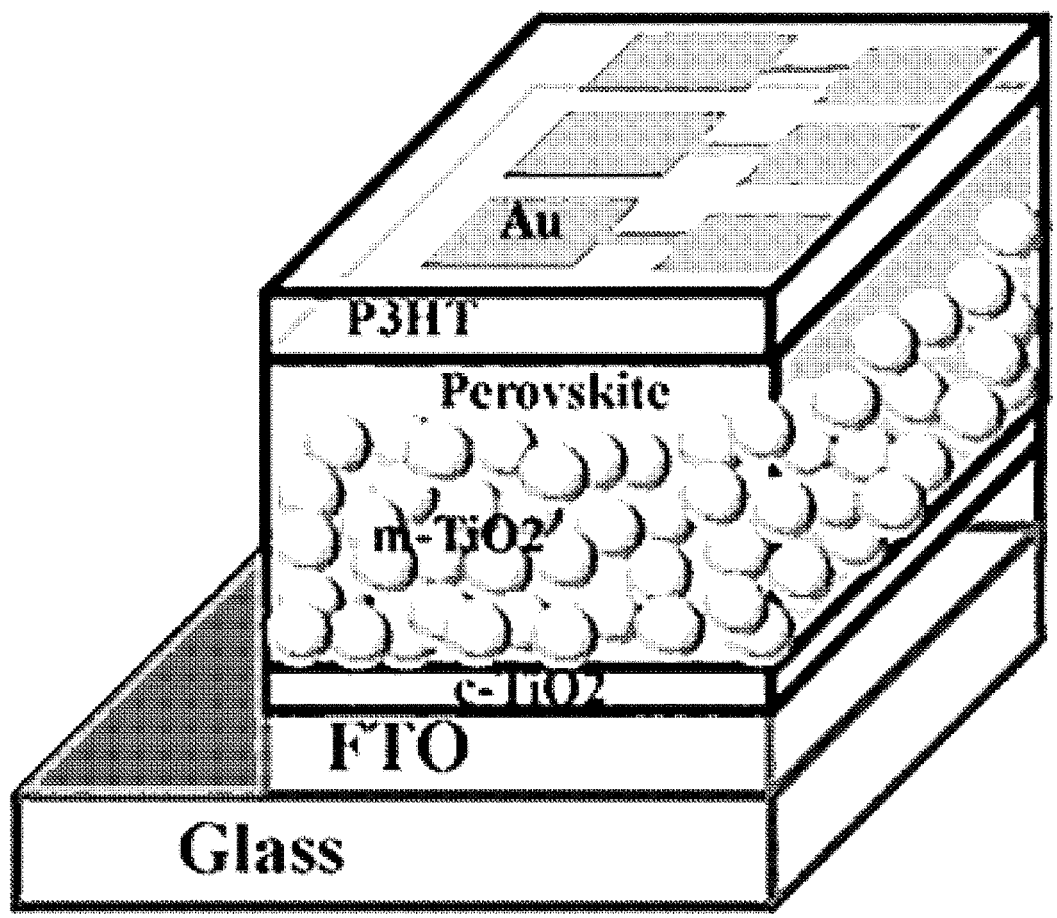
FIG. 3A illustrates a schematic of the structure of the perovskite solar cell, consistent with one or more exemplary embodiments of the present disclosure.
Figure 3B:
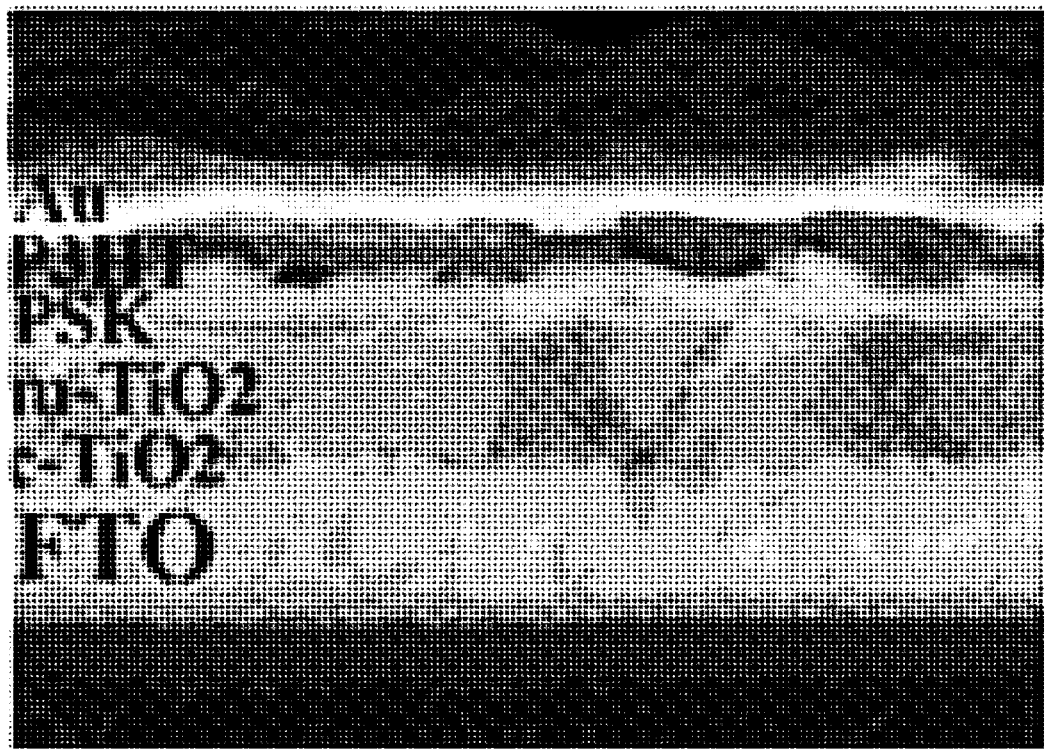
FIG. 3B illustrates an SEM image of a cross-section of the perovskite solar cell, consistent with one or more exemplary embodiments of the present disclosure.
Figure 3C:
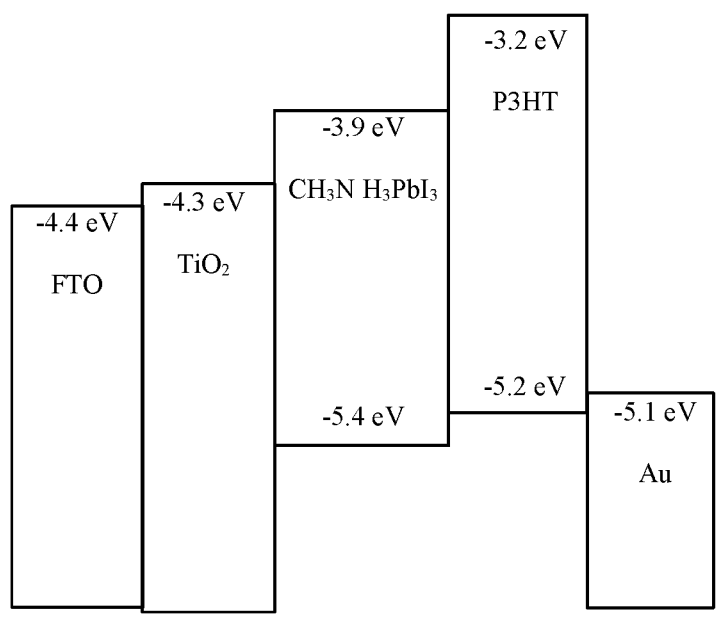
FIG. 3C illustrates a schematic of the energy band diagrams of different components of the perovskite solar cell, consistent with one or more exemplary embodiments of the present disclosure.

Next, P3HT is used as a hole transporting layer (HTL) that is spin coated from about 10 mg/ml solution of P3HT in chlorobenzene. Finally, an about 100 nm-thick Au layer is deposited on the top of the P3HT film by a thermal evaporator in a vacuum condition (about $10^{-5}$ torr). FIG. 3A shows a schematic of the fabricated exemplary perovskite solar cell. FIG. 3B shows a SEM cross-section of the exemplary perovskite solar cell. FIG. 3C shows the energy band diagrams of different components of the exemplary perovskite solar cell.

After absorbing incident photons by $CH_3NH_3PbI_3$, excitons with a low binding energy are generated and dissociated into a free charge carrier. To extract the photocurrent, photogenerated holes and electrons are transported to the FTO and the Au contact.

The fabricated exemplary perovskite solar cell, hereinafter referred to as the fresh perovskite solar cell, is stored in the ambient condition (with a relative humidity of about 25-30%) for 30 days, to obtain a degraded perovskite solar cell.

Referring again to FIG. 1, to recover the performance of the degraded perovskite solar cell by an implementation of the disclosed method, an implementation of the UV light 104 may be radiated on the degraded perovskite solar cell by an implementation of the UV light source 108 (for example, a pressure Hg lamp) from the Au contact side of the degraded perovskite solar cell for about 4 min, to obtain a recovered perovskite solar cell.

Figure 4:
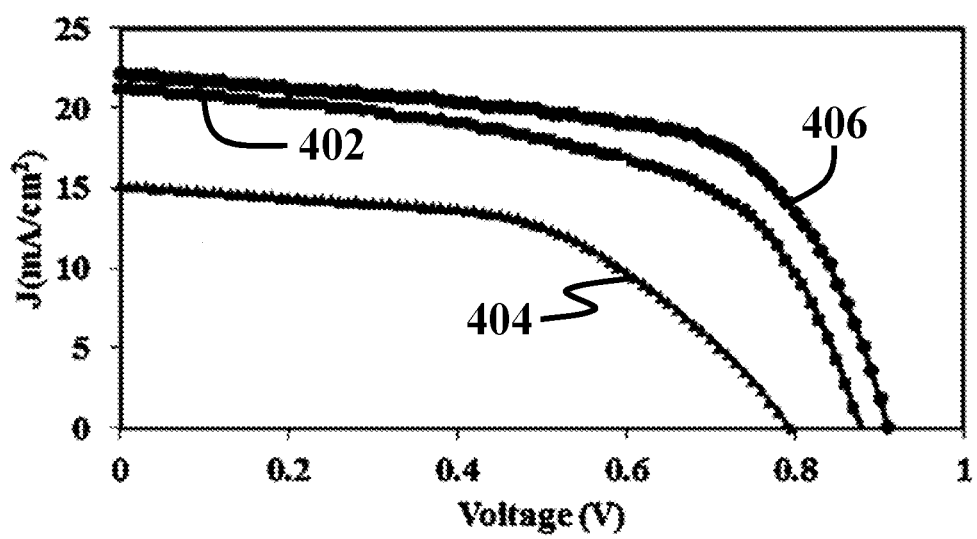
FIG. 4 illustrates current-voltage characteristics of a fresh, a degraded, and a recovered perovskite solar cell, consistent with one or more exemplary embodiments of the present disclosure.

Current-voltage (J-V) characteristics of the fresh perovskite solar cell is measured by an Iviumstat potentiostat under a calibrated AM 1.5 solar simulator at about 100 mW/cm² light intensity. FIG. 4 shows first J-V characteristics 402 of the fresh perovskite solar cell, second J-V characteristics 404 of the degraded perovskite solar cell, and third J-V characteristics 406 of the recovered perovskite solar cell by the example implementation of the disclosed method. As shown in FIG. 4, the performance of the degraded perovskite solar cell significantly increases after the UV-treatment. FIG. 4 shows that the performance of the recovered perovskite solar cell is about 20% higher than the performance of the fresh perovskite solar cell. In other words, the performance after recovery has even exceeded the initial performance of the fresh perovskite solar cell. The recovery effect of the UV-treatment may be attributed to interfaces modification in the degraded perovskite solar cell by dissociating adsorbed water molecules during the fabrication and storage of the perovskite solar cell.

The measured photovoltaic characteristics, including the short circuit current density ($J_{sc}$), the open circuit voltage ($V_{oc}$), the fill factor (FF), and the power conversion efficiency (PCE) of each of the fresh perovskite solar cell, the degraded perovskite solar cell, and the recovered perovskite solar cell are reported in Table 1. As shown in Table 1, PCE decreases from about 10.5% for the fresh perovskite solar cell to about 6.33% for the degraded perovskite solar cell during the storage time.

TABLE 1

Photovoltaic characteristics of the fresh, degraded, and recovered perovskite solar cells.

| Device | $V_{OC}$ (V) | $J_{SC}$ (mA/cm$^2$) | FF (%) | PCE (%) |
|---|---|---|---|---|
| Fresh perovskite solar cell | 0.88 | 21.19 | 56.2 | 10.5 |
| Degraded perovskite solar cell | 0.79 | 15.14 | 52.9 | 6.33 |
| Recovered perovskite solar cell | 0.92 | 22.21 | 61.5 | 12.58 |

Figure 5A:
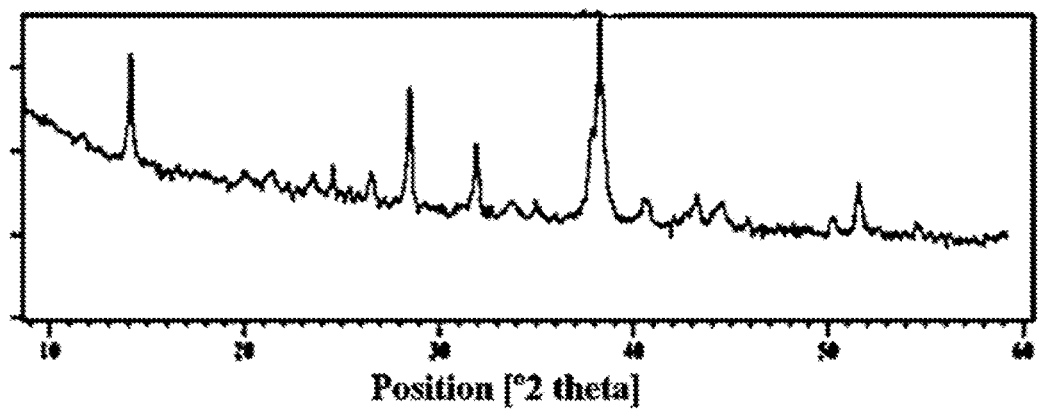
FIG. 5A illustrates an X-ray diffraction (XRD) pattern of a degraded perovskite solar cell, consistent with one or more exemplary embodiments of the present disclosure.
Figure 5B:
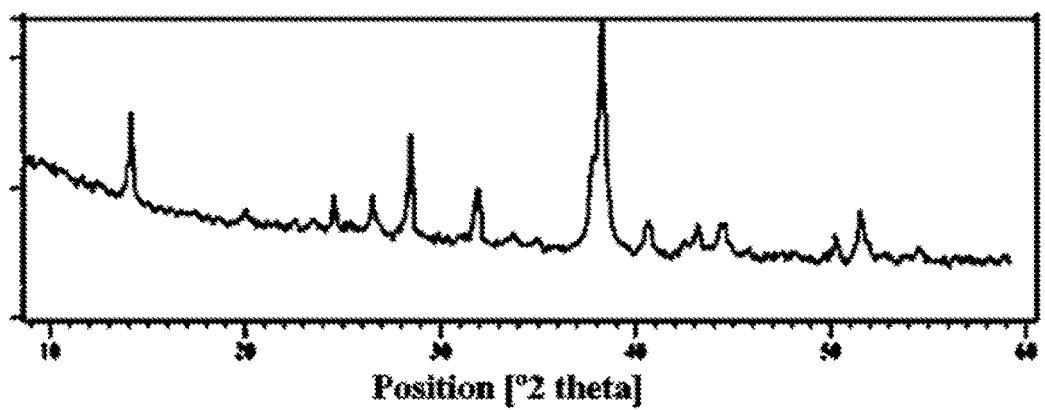
FIG. 5B illustrates an XRD pattern of a recovered perovskite solar cell, consistent with one or more exemplary embodiments of the present disclosure.

Because of the possibility of the degradation of solar cell layers under the UV-treatment, The XRD diffraction peaks of the fabricated perovskite solar cell before and after UV-treatment are recorded by a Philips diffractometer (model: X'Pert MPD) equipped with a proportional Xe filled detector, a Cu tube ($\lambda$=1.54056 Å). FIG. 5A shows the XRD pattern of the degraded perovskite solar cell (before the UV-treatment), and FIG. 5B shows the XRD pattern of the recovered perovskite solar cell (after the UV-treatment). The perovskite layer is the main crystalline layer that has sharp peaks in the XRD patterns. There is no sign of the presence of PbI$_2$ peaks in the XRD pattern of FIG. 5B. Therefore, it is clear that no decomposition happens in the perovskite layer during the UV-light irradiation since the perovskite layer decomposition leads to the formation of PbI$_2$.

Example 2: Recovering a Degraded HTM-Free Solar Cell

In this example, an exemplary HTM-free solar cell is fabricated according to the procedure explained in Example 1, except that no HTM is used in the exemplary HTM-free solar cell, to show that the effectiveness of the disclosed method works for structures with various different solar cell components.

After obtaining a fresh HTM-free solar cell, it is kept in the ambient condition for 7 days to obtain a degraded HTM-free solar cell. Similar to Example 1, the degraded HTM-free solar cell is recovered by an example implementation of the disclosed method. A UV-light is radiated on the Au side of the degraded HTM-free solar cell to obtain a recovered HTM-free solar cell. Table 2 shows photovoltaic characteristics of the fresh HTM-free solar cell, the degraded HTM-free solar cell, and the recovered HTM-free solar cell, under a 1-sun illumination. As shown in Table 2, PCE of the fresh HTM-free solar cell is about 2.06% that reduces to 1.4% after the 7 day storage, for the degraded HTM-free solar cell, and is then enhanced to about 3.2% after recovery by the UV-treatment, for the recovered HTM-free solar cell.

TABLE 2

Photovoltaic characteristics of the fresh, degraded, and recovered HTM-free solar cells.

| Device | $V_{OC}$ (V) | $J_{SC}$ (mA/cm$^2$) | FF (%) | PCE (%) |
|---|---|---|---|---|
| Fresh HTM-free solar cell | 0.75 | 5.5 | 5 | 2.0625 |
| Degraded HTM-free solar cell | 0.73 | 4 | 49 | 1.4 |
| Recovered HTM-free solar cell | 0.79 | 7 | 58 | 3.2074 |

Example 3: Recovering a Degraded Solar Cell by UV Radiations with Different Powers In this example, the exemplary degraded perovskite solar cell described in Example 1 is recovered by two example implementations of the disclosed method. In a first exemplary implementation, a UV-light source with power of about 400 Watts is used for radiating a UV light on the degraded solar cell. In a second exemplary implementation, a UV-light source with a power of about 1000 W is used for radiating a UV light on the degraded solar cell. The photovoltaic characteristics of the fresh perovskite solar cell, the degraded perovskite solar cell, and the recovered perovskite solar cell for each of the example implementations are presented in Table 3.

TABLE 2

Photovoltaic characteristics of the fresh, degraded, and recovered perovskite solar cells under different UV radiation powers.

| Device | $V_{OC}$ (V) | $J_{SC}$ (mA/cm$^2$) | FF (%) | PCE (%) |
|---|---|---|---|---|
| UV-400 W | | | | |
| Fresh perovskite solar cell | 0.85 | 19.5 | 60.1 | 10 |
| Degraded perovskite solar cell | 0.83 | 13.1 | 58 | 6.3 |
| Recovered perovskite solar cell | 0.88 | 20.1 | 62.5 | 11 |
| UV-1000 W | | | | |
| Fresh perovskite solar cell | 0.86 | 19.7 | 59.8 | 10.13 |
| Degraded perovskite solar cell | 0.86 | 12.14 | 56.9 | 5.9 |
| Recovered perovskite solar cell | 0.9 | 22 | 61.5 | 12.1 |

Example 4: Recovering a Degraded Polymer Solar Cell

In this example, an exemplary degraded polymer solar cell is recovered by an exemplary implementation of the disclosed method. To fabricate the exemplary polymer solar cell, an indium tin oxide (ITO) substrate is etched and cleaned with deionized water, acetone, hexane, and isopropanol. A ZnO layer is deposited on ITO via a hydrothermal method by using a zinc acetate and KOH. The ZnO layer serves as an electron transporting layer (ETL). Next, a solution of PCBM and P3HT (a 1:1 weight ratio, about 30 mg/ml in dichlorobenzene) is spin-coated on the ZnO layer with about 1500 RPM for about 50 s. Next, the coated substrate is heated at about 140° C. for removing the residual solvents and annealing an active layer of the exemplary polymer photovoltaic cell under an inert gas. Finally, an about 100 nm thick Ag layer is deposited on the top of the film by using a thermal evaporator in a vacuum condition (<10$^{-5}$ torr).

The active layer is sandwiched between two contacts and involves a blend of a conjugated polymer (P3HT) as a donor and a PCBM as an acceptor that form a nanoscale interpenetration network. When incident photons from a transparent contact are absorbed by the active layer, excitons are generated in conjugated polymers. Since the dielectric constants of conjugated polymers are low, there is a strong Coulomb attraction force between photoexcited electrons and holes which reduces the probability of the exciton dissociation under the ambient condition. Therefore, an acceptor material with a higher electron affinity is required for dissociation of excitons into free charge carriers. In a normal structure, excitons are dissociated at the donor-acceptor interface, holes are transferred throughout the highest occupied molecular orbitals (HOMO) of the polymer and collected at the anode, and electrons are transferred from the LUMO of the donor to the LUMO of the acceptor, transported to the cathode, and collected at the cathode.

Figure 6A:
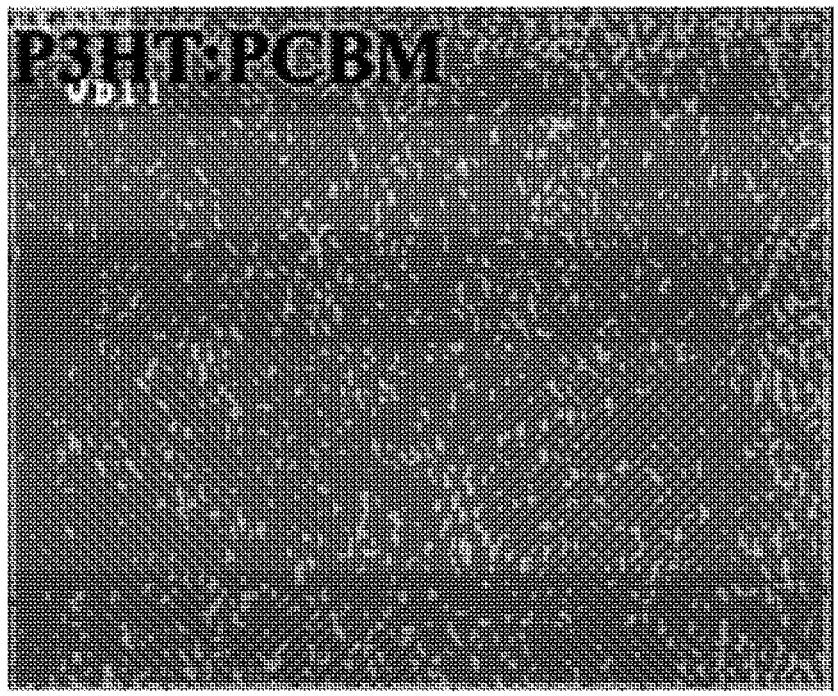
FIG. 6A is an SEM image of a surface of an active layer of a polymer solar cell, consistent with one or more exemplary embodiments of the present disclosure.
Figure 6B:
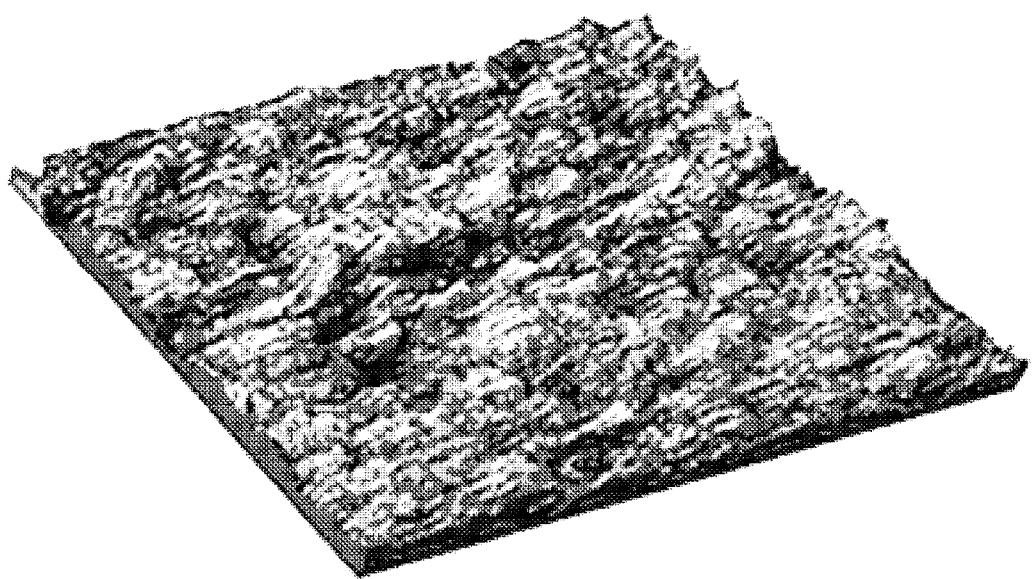
FIG. 6B illustrates a topography image of a surface of an active layer of a polymer solar cell, consistent with one or more exemplary embodiments of the present disclosure.

FIG. 6A shows a SEM image of the active layer of an exemplary fabricated polymer solar cell, hereinafter referred to as the fresh polymer solar cell. FIG. 6B shows a topography image of the active layer. The fresh polymer solar cell is stored in the ambient condition for about 3 weeks to obtain a degraded polymer solar cell. Similar to Example 1, the degraded polymer solar cell is recovered by an implementation of the disclosed method, and a recovered polymer solar cell is obtained. Table 3 shows the photovoltaic characteristics of the fresh polymer solar cell, the degraded polymer solar cell, and the recovered polymer solar cell, under a 1-sun illumination.

TABLE 4

Photovoltaic characteristics of the fresh, degraded, and recovered polymer solar cells.

| Device | $V_{OC}$ (V) | $J_{SC}$ (mA/cm$^2$) | FF (%) | PCE (%) |
|---|---|---|---|---|
| Fresh polymer solar cell | 0.42 | 13.3 | 0.34 | 1.8 |
| Degraded polymer solar cell | 0.41 | 9.45 | 0.3 | 1.16 |
| Recovered polymer solar cell | 0.415 | 13.97 | 0.34 | 1.97 |

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A method for recovering a degraded solar cell comprising a metal contact located on a side of the degraded solar cell, the method comprising:
    radiating an ultraviolet (UV) light on the side of the degraded solar cell for a period of time in a range of 30 seconds to 5 minutes by a UV light source with a power in a range of 100 Watts to 1000 Watts, the UV light source placed at a distance in a range of 15 cm to 25 cm from the degraded solar cell, the degraded solar cell one of a degraded polymer solar cell and a degraded perovskite solar cell.

2. A method for recovering a degraded solar cell, the method comprising radiating an ultraviolet (UV) light on the degraded solar cell for a period of time in a range from 30 seconds to 5 minutes.

3. The method of claim 2, wherein the degraded solar cell comprises a metal contact located on a side of the degraded solar cell.

4. The method of claim 3, wherein radiating the UV light comprises radiating the UV light on the side of the degraded solar cell.

5. The method of claim 2, wherein radiating the UV light comprises radiating the UV light by a UV light source placed at a distance of 15 cm to 25 cm from the degraded solar cell.

6. The method of claim 2, wherein radiating the UV light comprises radiating the UV light by a UV light source with a power in a range of 100 Watts to 1000 Watts.

7. The method of claim 2, wherein radiating the UV light on the degraded solar cell comprises radiating the UV light on a degraded polymer solar cell.

8. The method of claim 2, wherein radiating the UV light on the degraded solar cell comprises radiating the UV light on a degraded perovskite solar cell.

\* \* \* \* \*